United States Patent [19]
Yiu et al.

[11] Patent Number: 5,942,800
[45] Date of Patent: Aug. 24, 1999

[54] STRESS BUFFERED BOND PAD AND METHOD OF MAKING

[75] Inventors: Ho-Yin Yiu, Hong Kong, The Hong Kong Special Administrative Region of the People's Republic of China; Lin-June Wu, Hsin-Chu, Taiwan; Bor-Cheng Chen, Taipei, Taiwan; Jan-Her Horng, Kaohsiung, Taiwan

[73] Assignee: Taiwan Semiconductor Manufacturing Co., Ltd., Hsin-chu, Taiwan

[21] Appl. No.: 09/102,309

[22] Filed: Jun. 22, 1998

[51] Int. Cl.⁶ .................................................. H01L 23/48
[52] U.S. Cl. .......................... 257/754; 257/755; 257/765; 257/390; 257/391; 257/211
[58] Field of Search ..................................... 257/754, 750, 257/755, 756, 757, 758, 739, 765, 771, 773, 774, 775, 786, 210, 211, 390, 391, 784

[56] References Cited

U.S. PATENT DOCUMENTS 4,984,061  1/1991  Matsumoto .......................... 257/776
5,598,028  1/1997  Losavio et al. ...................... 257/644
5,686,762  11/1997 Langley ................................ 257/775

Primary Examiner—Tom Thomas
Assistant Examiner—Luan Thai
Attorney, Agent, or Firm—Tung & Associates

[57] ABSTRACT

A method for forming a chess-board patterned bond pad structure with stress buffered characteristics and the bond pad structure formed are disclosed. In one method, a multiplicity of field oxide regions are first formed in the surface of a silicon substrate. A conductive layer such as polycide is then deposited and formed on the substrate to form a stepped surface with a metal layer subsequently deposited on top of the conductive layer to form a bond pad. The stepped structure reproduced on the metal layer serves to distribute bonding stresses during a wire bonding process such that bond pad lift-off defects are substantially eliminated. In another method, the conductive layer is first formed into conductive gates with insulating sidewalls formed subsequently. Similarly stepped surface on a metal layer can be obtained to realize the stress buffered characteristics of the novel method.

20 Claims, 4 Drawing Sheets

STRESS BUFFERED BOND PAD AND METHOD OF MAKING

FIELD OF THE INVENTION

The present invention generally relates to a chess-board patterned bond pad structure that has stress buffered characteristics and a method for making such structure and more particularly, relates to a chess-board patterned bond pad structure on a semiconductor device that is fabricated on a stepped surface formed by a multiplicity of conductive gates and bird's beak field oxide regions such that force incurred in wire bonding can be buffered and a method for fabricating such structure.

BACKGROUND OF THE INVENTION

In the fabrication processes for semiconductor devices, an integrated circuit chip is frequently assembled in a package in a final process step to complete the fabrication process. The assembled package can then be connected to a printed circuit board as part as a large circuit. To establish an electrical communication with the integrated circuit chip, a wire bonding process is frequently used to connect a multiplicity of bond pads on the integrated circuit chip to the outside circuitry.

In a typical IC chip, active circuit elements such as transistors, resistors, etc., are positioned in the central portion, i.e., the active region, of the chip while the bond pads are normally arranged around the periphery of the active region such that active circuit elements are not likely to be damaged during a subsequent bonding process. When a wire bonding process is performed on a bond pad on an IC chip, the process normally entails the bonding of a gold or aluminum wire to the bond pad by fusing the two together with ultrasonic energy. The wire is then pulled away from the bond pad after the bond is formed. During the pulling of the gold wire from the bond, a defect known as bond pad lift-off is frequently encountered. It occurs based on the fact that during the attaching process of a gold wire to a bond pad, a high level of stress is placed on the bond pad. It occurs because a relatively large, heavy bond is placed on top of layers which may not have strong adhesion to the underlying layers. For instance, one factor that affects adhesion between the layers is the common usage of a diffusion barrier layer formed of a material such as TiN for preventing aluminum diffusion into underlying conductive layers during subsequent high temperature processes. The diffusion barrier layer utilized, i.e., TiN, TiW or other alloys, does not have a strong adhesion to the underlying oxide layer in the bond pad. This is only one reason that bond pad lift-off defect occurs. Other reasons such as the high bonding stress and the high pull force also contribute to the lift-off problem. Most lift-off problems occur at an interface between a polycide layer and a field oxide layer.

It is therefore an object of the present invention to provide a bond pad structure that does not have the drawbacks and shortcomings of the conventional bond pad structures used on integrated circuit devices.

It is another object of the present invention to provide a bond pad structure on a semiconductor device that is formed in a chess-board patterned such that bonding stress can be buffered to prevent bond pad lift-off defect from occurring.

It is a further object of the present invention to provide a chess-board patterned bond pad structure that has stress buffered characteristics by first building a multiplicity of bird's beak field oxide regions on a silicon substrate.

It is another further object of the present invention to provide a chess-board patterned bond pad structure on a semiconductor device that has stress buffered characteristics by first building a multiplicity of bird's beak field oxide regions on a silicon substrate, then depositing a conductive material layer on the field oxide regions to form a stepped surface such that bonding stress can be more effectively distributed.

It is still another object of the present invention to provide a chess-board patterned bond pad structure on a semiconductor device that has stress buffered characteristics by first building a multiplicity of bird's beak field oxide regions on a silicon substrate, and then forming a multiplicity of conductive gates on each of the field oxide regions resulting a stepped surface.

It is yet another object of the present invention to provide a chess-board patterned bond pad structure on a semiconductor device that has stress buffered characteristics by first building a multiplicity of bird's beak field oxide regions on a silicon substrate and then forming a multiplicity of polycide gates on each of the field oxide regions resulting in such that, after a metal layer is deposited on top, a stepped surface is formed to more effectively distribute a bonding stress.

It is still another further object of the present invention to provide a method for fabricating a chess-board patterned bond pad structure by first forming a multiplicity of field oxide regions in rows and columns in a surface layer of a silicon substrate and then depositing a conductive material layer on top of the silicon substrate to form a stepped surface prior to the deposition of a metal layer on top.

It is yet another further object of the present invention to provide a method for fabricating a chess-board patterned bond pad structure on a semiconductor device by first forming a multiplicity of bird's beak field oxide regions in the surface of a silicon substrate and then forming a multiplicity of polycide gates on each of the multiplicity of bird's beak field oxide regions prior to the deposition of a metal layer on top.

SUMMARY OF THE INVENTION

In accordance with the present invention, a chess-board patterned bond pad structure on a semiconductor device is provided which consists of a multiplicity of field oxide regions formed in a surface layer of a silicon substrate and a conductive layer deposited on top of the field oxide regions forming a stepped surface prior to the deposition of a metal layer on top to achieve stress buffered characteristics.

In a preferred embodiment, a chess-board patterned bond pad structure that has stress buffered characteristics is provided which includes an electronic substrate, a multiplicity of field oxide regions formed in rows and columns embedded in a surface layer of the electronic substrate while partially protruding from a planar surface of the electronic substrate forming a first stepped surface, a conductive layer deposited on the electronic substrate overlying the multiplicity of field oxide regions forming a second stepped surface conforming to the first stepped surface, and a metal layer overlying the conductive layer conforming to a topography of the conductive layer thus forming a third stepped surface for the bond pad structure adapted for connecting to a bonding wire. The electronic substrate may be a silicon substrate. The multiplicity of field oxide regions may be bird's beak oxide regions grown in a top surface of a silicon wafer in both lateral and transverse directions to form a first stepped surface. The conductive layer deposited may be a non-metallic layer, or a polycide layer. The metal layer may be formed of a material such as Al, AlCu or AlCuSi. The metal layer further reacts with the conductive layer of polycide. The structure may further include a layer of Al or Au on top of the metal layer as wiring to the bond pad.

The chess-board patterned bond pad structure may further include an adhesion layer on top of the metal layer, a metal pad layer formed substantially of AlCuSi on top of the adhesion layer, and a metal wiring layer of substantially Al on top of the metal pad layer. The conductive layer may also be formed into a multiplicity of conductive gates each situated on top of a field oxide region. The multiplicity of conductive gates may further include insulating sidewall spacers formed surrounding the gates.

In another preferred embodiment, a chess-board patterned bond pad structure that has stress buffered characteristics is provided which includes a substrate, a multiplicity of field oxide regions formed in rows and columns embedded in a surface layer of the substrate while partially protruding from a planar surface of the substrate to form a first stepped surface, a multiplicity of gates each formed of a conductive material situated on each of the multiplicity of field oxide regions, and a metal layer overlying and conforming to a topography of the multiplicity of gates, the multiplicity of field oxide regions and the substrate to form a second stepped surface for the bond pad structure adapted for establishing electrical communication with a bonding wire. The substrate provided may be a silicon substrate. The multiplicity of field oxide regions provided may be bird's beak oxide regions which are grown in a top surface of the silicon wafer in both lateral and transverse directions for forming a first stepped surface. Each of the multiplicity of polycide gates may also be surrounded on its sides by an insulating sidewall spacer. Each of the multiplicity of polycide gates may also be surrounded on its sides by a sidewall spacer formed of silicon oxide which improves bonding between the multiplicity of gates and the multiplicity of field oxide regions. The multiplicity of gates may be formed of a non-metallic material. The metal layer may be formed of a material such as Al, AlCu or AlCuSi.

The present invention is further directed to a method for fabricating a chess-board patterned bond pad structure which includes the operating steps of first providing an electronic substrate, then forming a multiplicity of field oxide regions in rows and columns in a surface layer of the electronic substrate such that the multiplicity of field oxide regions partially protruding from a planar surface of the electronic substrate to form a first stepped surface, depositing a conductive material layer on top of the electronic substrate overlying the multiplicity of field oxide regions to form a second stepped surface conforming to the first stepped surface, and depositing a metal layer on top of the conductive material layer conforming to a topography of the conductive material layer to thus form a third stepped surface as a bond pad structure for connecting to a bonding wire.

The method may further include the step of forming a multiplicity of field oxide regions by a bird's beak process. The method may further include the step of forming the multiplicity of field oxide regions by a bird's beak process utilizing a silicon nitride mask. The method may further include the step of depositing a conductive layer from a non-metallic material, such as polysilicon. The method may further include the step of forming a polycide layer at an interface between the conductive layer of polysilicon and the metal layer of WSi, TiSi or TaSi. The method may further include the step of depositing an adhesion layer and a metal pad layer sequentially on top of the metal layer. The method may further include the step of forming a multiplicity of gates from the conductive layer such that one of the multiplicity of gates is situated on each of the field oxide region. The method may further include the steps of forming a multiplicity of gates from the conductive layer such that one of the multiplicity of gates is situated on each of the field oxide regions, and forming an insulating sidewall spacer around each of the multiplicity of gates such that adhesion between the gates and the field oxide region can be improved.

In still another preferred embodiment, a method for fabricating a chess-board patterned bond pad structure on a semiconductor device is provided which can be carried out by first providing a silicon substrate, then forming a multiplicity of bird's beak field oxide regions in a chess-board patterned in a surface layer of the silicon substrate such that bird's beak field oxide regions partially protruding from a planar surface of the silicon substrate to form a first stepped surface, depositing a conductive material layer on top of the multiplicity of bird's beak field oxide regions and the silicon substrate, forming a multiplicity of gates from the conductive material layer each situated on one of the multiplicity of bird's beak field oxide regions, and depositing a metal layer overlying the multiplicity of gates, the multiplicity of bird's beak field oxide regions and the silicon substrate to form a second stepped surface for the bond pad structure with improved stress buffered characteristics. The method may further include the step of forming a multiplicity of insulating sidewall spacers on each of the multiplicity of gates. The method may further include the step of forming a multiplicity of silicon oxide sidewall spacers on the multiplicity of gates for improving bonding between the multiplicity of gates and the multiplicity of bird's beak field oxide regions. The method may further include the steps of depositing an adhesion layer on top of the metal layer, depositing a metal pad layer including Al, Si or Cu on top of the adhesion layer, and then connecting a metal wiring to the metal pad layer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a chess-board patterned bond pad structure that has stress buffered characteristics for semiconductor devices and a method for fabricating such bond pads. In a preferred embodiment, the present invention bond pad can be fabricated by first forming bird's beak field oxide regions in the surface of a silicon substrate in a chess-board patterned (in rows and columns), a conductive layer is then deposited on top of the silicon substrate which is then covered by the deposition of a metal layer. A bond pad having a stepped surface is thus produced which is capable of more efficiently distribute bonding stress placed on the bond pad during a wire bonding process. In an alternate embodiment, the present invention chess-board bond pad structure can be fabricated by first forming a multiplicity of bird's beak field oxide regions in the surface layer of a silicon substrate, a conductive layer is then deposited on the substrate and subsequently formed into a multiplicity of conductive gates with one on each field oxide region. A metal layer is then deposited on the conductive gates and the silicon substrate to form a stepped surface for the novel bond pad structure.

Figure 1:
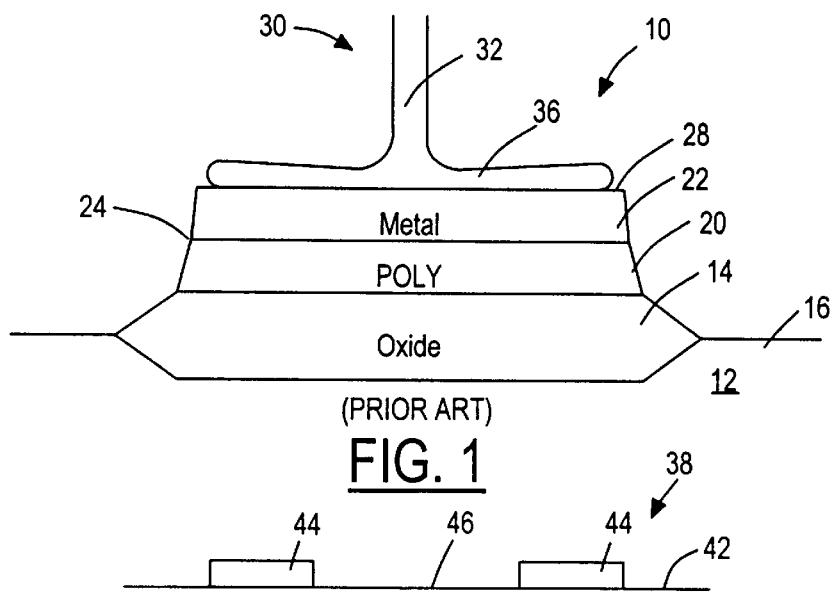
FIG. 1 is an enlarged, cross-sectional view of a conventional bond pad structure with a wire bonded on top.

The present invention novel method for forming a chess-board patterned bond pad structure provides greatly improved and unexpected benefits over the conventional structure of bond pads. For instance, as shown in FIG. 1, a conventional bond pad structure 10 is built on a silicon substrate 12 by first forming bird's beak field oxide region 14 in the surface layer 16 of the silicon substrate 12. On top of the field oxide region 14, a conductive layer such as polysilicon is then deposited and formed by a photolithography method into a polysilicon layer 20. On top of the polysilicon layer 20, a metal layer 22 such as WSi, TiSi or TaSi is then deposited and formed. In a subsequent annealing process, a polycide layer 24 is formed at the interface between the polysilicon layer 20 and the metal layer 22. On the top surface 28 of the metal layer 22, a wire bond 30 formed by a metal wire 32 and a solder material 36 is then formed. During the bonding process, once a bond is formed between solder 36 and the metal surface 28, the metal wire 32 is pulled away for making connection with a lead finger. During the wire-pull process, the stress acted on the interface between solder 36 and metal surface 28 is sufficiently high such that a bond pad lift-off defect is frequently observed (not shown in FIG. 1).

Figure 2A:
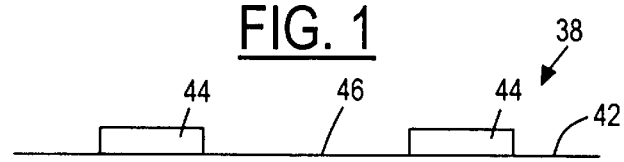
FIG. 2A is an enlarged, cross-sectional view of a present invention electronic substrate having a patterned nitride mask on top.

The present invention novel method and device formed are provided to benefit from stress buffered characteristics such that the bond pad lift-off defect can be substantially eliminated. Referring now to FIG. 2A, wherein a present invention electronic device 38 which is built on a silicon substrate 40 is shown. On a top surface 42 of the silicon substrate 40, a layer of nitride (not shown) is first deposited and then formed into a nitride pattern 44 exposing areas 46 where bird's beak field oxide regions are to be formed.

Figure 2B:
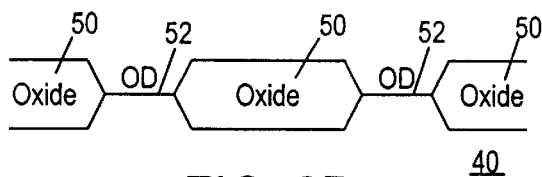
FIG. 2B is an enlarged, cross-sectional view of the electronic substrate of FIG. 2A having bird's beak field oxide regions formed in an oxidation process.

In the next step of the process, an oxidation method is used to grow bird's beak oxide regions 50 while leaving the areas 52, i.e., the active regions, that were covered by the nitride mask 44 intact. The multiplicity of field oxide regions 50 formed can be suitably controlled depending on the severity of the bonding stress involved and the degree of stress buffer desired. In a typical bond pad, as many as between 50~100 bird's beak field oxide regions may be formed to produce a stepped surface. This is shown in FIG. 2B.

Figure 2C:
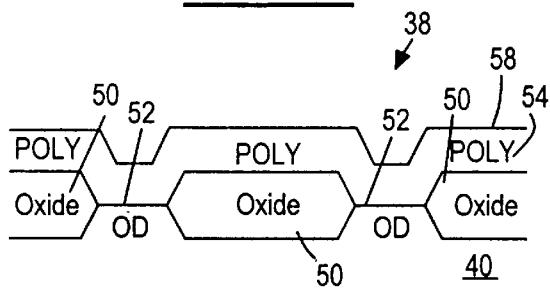
FIG. 2C is an enlarged, cross-sectional view of the present invention electronic substrate of FIG. 2B having a conductive layer deposited on top.

On top of the field oxide regions 50 and the active regions 52 is then deposited a conductive layer 54. The conductive layer 54 may be deposited of a material such as a polycide. Any other suitable conductive material may similarly be used. It is noticed that the top surface 58 on the conductive material layer 54 conforms to the topography of the field oxide regions 50 and the active regions 52. This is shown in FIG. 2C.

Figure 2D:
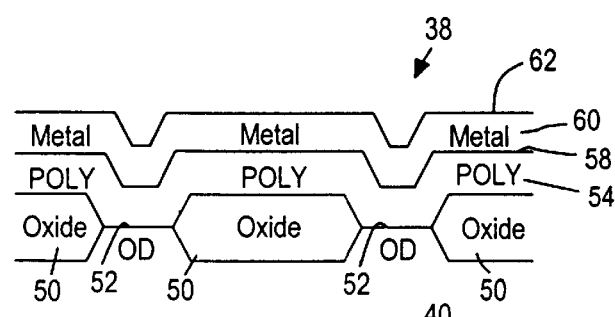
FIG. 2D is an enlarged, cross-sectional view of the present invention electronic substrate of FIG. 2C having a metal layer deposited on top of the conductive layer.

In the final process step for forming the present invention novel chess-board bond pad structure, a metal layer 60 normally of a material such as an aluminum alloy of AlCuSi or AlCu is deposited on the top surface 58 of the conductive layer 54. The top surface 62 of the metal layer 60 conforms to the surface 58 of the conductive layer 54, i.e., the stepped surface of 58 is reproduced on surface 62. This is shown in FIG. 2D.

Figure 2E:
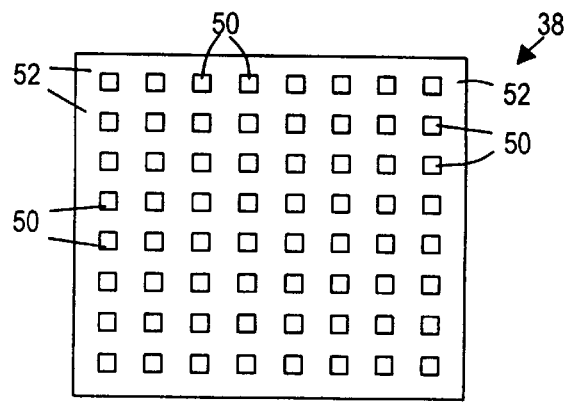
FIG. 2E is an enlarged, plane view of a bond pad having the present invention stress buffered structure.

FIG. 2E shows an enlarged, plane view of the present invention chess-board patterned bond pad structure on the electronic device 38. It should be noted that the number of bird's beak field oxide regions to be formed can be pre-determined based on the degree of stress buffer desired and the type of bonding process utilized.

Figure 3:
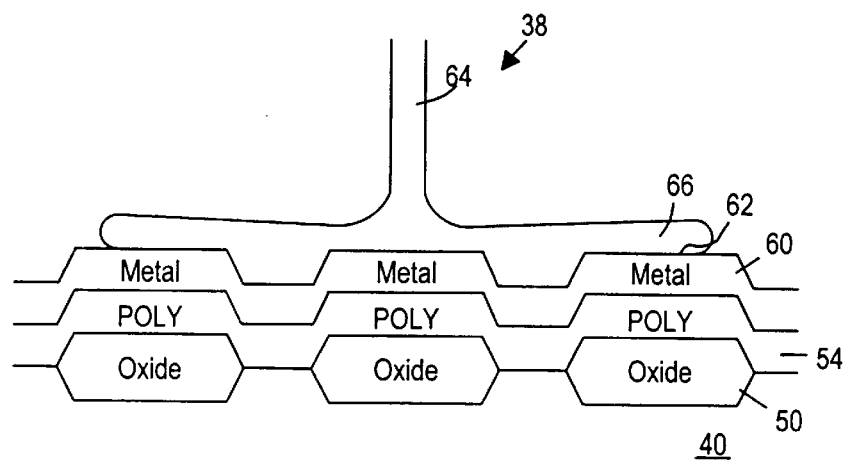
FIG. 3 is an enlarged, cross-sectional view of the present invention chess-board patterned bond pad with a wire bonded on top.

FIG. 3 shows an enlarged, cross-sectional view of the present invention chess-board patterned bond pad structure 38. A metal wire 64 is bonded to the top surface 62 of the metal layer 60 by a solder material 66. By the action of the present invention novel stepped surface 62, the bonding stress acted on the bond pad 38, both during the wire planting step and the wire pulling-away step, is distributed more evenly on the surface of the bond pad 38. For instance, based on the stepped surface 62, some components of the bonding stress are acting in a lateral direction and thus are more easily absorbed and distributed by the bond pad 38. This is in contrast to a conventional bond pad structure (as shown in FIG. 1), wherein the bonding stress acts in a perpendicular direction on the surface of the metal layer.

Figure 4:
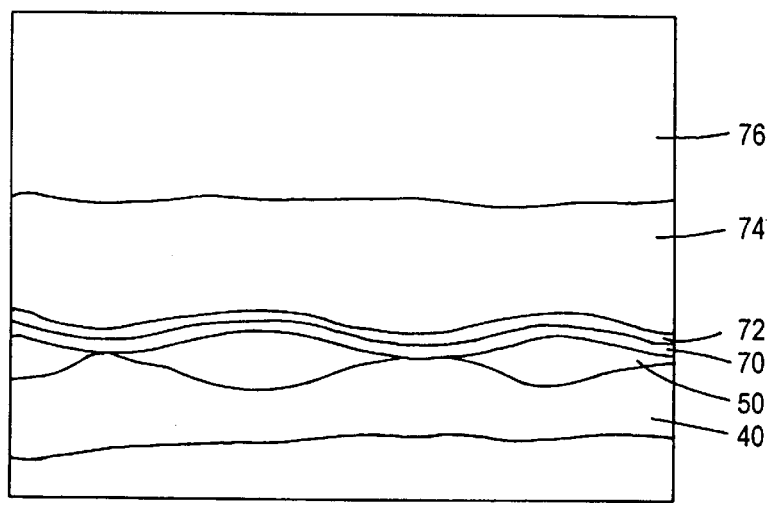
FIG. 4 is a trace of an electron micrograph of a present invention bond pad structure.

A trace of an electron microscopic image of a cross-section of the present invention bond pad 38 is shown in FIG. 4. Field oxide regions 50 are formed in the surface layer of the silicon substrate 40. The polysilicon layer 70 has substantially reacted with the metal layer 74 of AlCuSi to form a polycide layer 72. On top of the metal layer 74, a metal wire 76 of either Au or Al is bonded thereto. The effectiveness of the present invention novel method and novel bond pad formed is therefore amply demonstrated in FIG. 4.

Figure 5A:
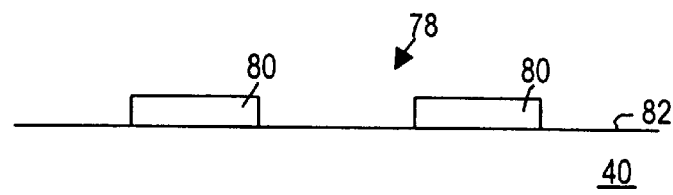
FIG. 5A is an enlarged, cross-sectional view of an electronic substrate for the present invention alternate embodiment.
Figure 5B:
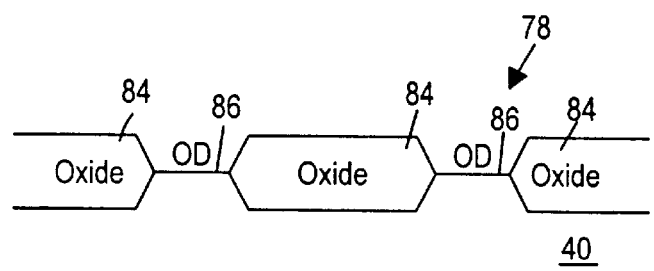
FIG. 5B is an enlarged, cross-sectional view of the electronic substrate of FIG. 5A with bird's beak field oxide regions formed.
Figure 5C:
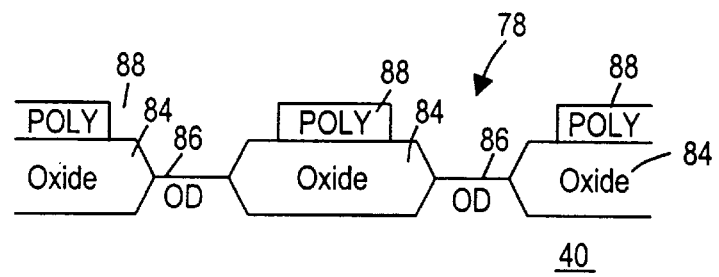
FIG. 5C is an enlarged, cross-sectional view of the present invention electronic substrate of FIG. 5B having a conductive layer deposited and gates formed on top.

An alternate embodiment, as shown in FIGS. 5A~5E and FIG. 6, is a modification of the present invention preferred embodiment. As shown in FIG. 5A, a nitride mask 80 is first patterned on the surface 82 of a silicon substrate 40. Bird's beak silicon oxide regions 84 are then grown with active regions 86 intact, similar to that shown in FIG. 2B. On top of the field oxide regions 84 and the active regions 86, is then deposited conductive layers such as a polysilicon layer and a metal silicide layer. The conductive layers are then formed by a photolithographic method into polycide gates 88 with one of the gates sits on top of each field oxide region 84. This is an additional process step that was not carried out in the preferred embodiment method. This is shown in FIG. 5C.

Figure 5D:
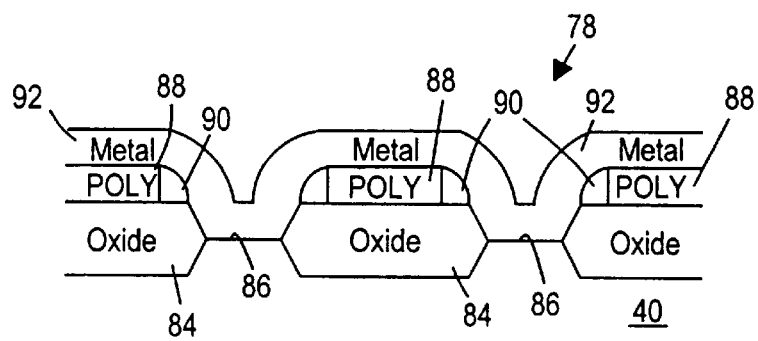
FIG. 5D is an enlarged, cross-sectional view of the electronic substrate of FIG. 5C having a metal layer deposited on top.
Figure 5E:
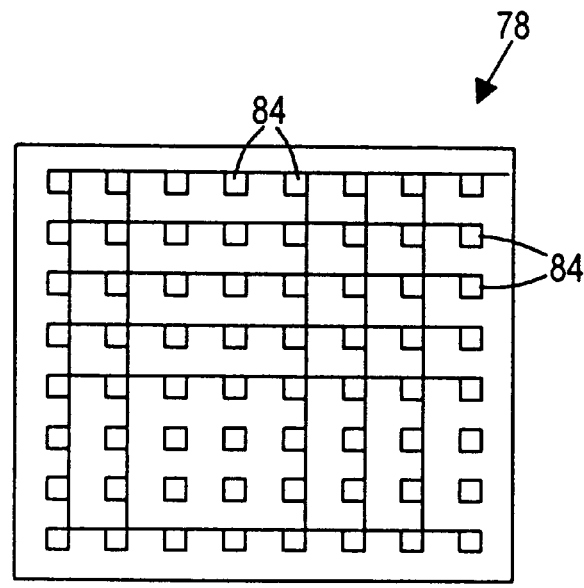
FIG. 5E is an enlarged, plane view of the present invention chess-board patterned bond pad structure in an alternate embodiment.

Subsequently, oxide spacers 90, or spacers of other insulating materials can be formed by first depositing an insulating material layer (not shown) and then anisotropically etching to form sidewall spacers 90. When a silicon oxide material is utilized in forming the sidewall spacers 90, the spacers 90 form an intimate and strong bond with the field oxide regions 84 and thus improving the adhesion between the polycide gates 88 and the field oxide regions 84. This is shown in FIG. 5D. On top of the polycide gates 88 and the sidewall spacers 90, is then deposited a metal layer such as AlCuSi to conform to the stepped surface formed by the field oxide regions 84, the polycide gates 88 and the sidewall spacers 90. A similarly desirable stepped surface for the bond pad structure 78 is thus formed. An enlarged, plane view of the chess-board patterned bond pad structure according to the present invention alternate embodiment is shown in FIG. 5E.

Figure 6:
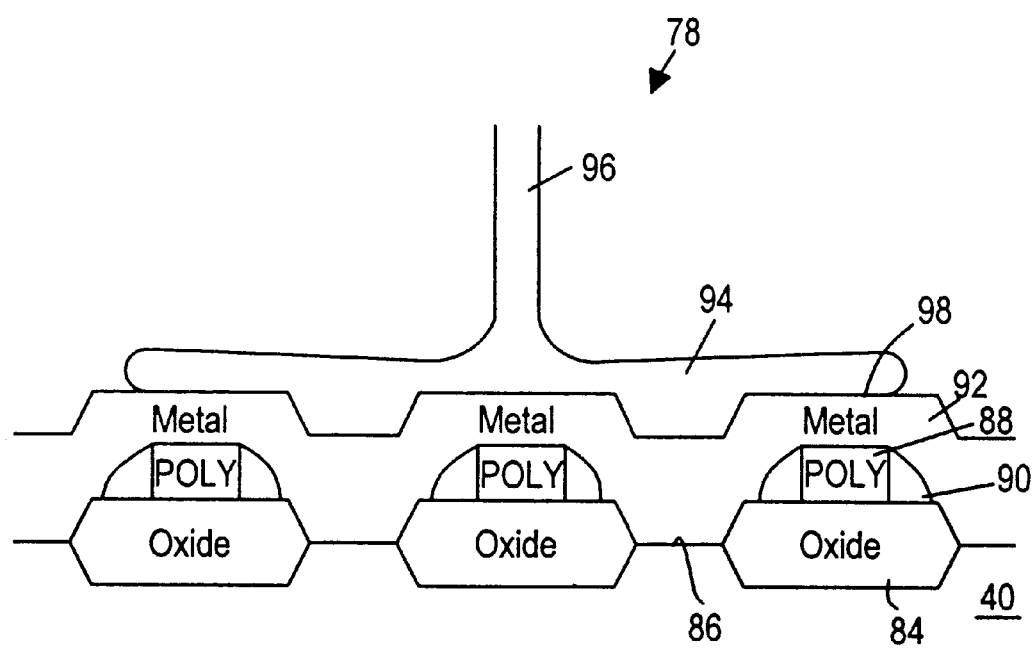
FIG. 6 is an enlarged, cross-sectional view of the present invention bond pad structure in the alternate embodiment.

FIG. 6 is an enlarged, cross-sectional view of the present invention chess-board patterned bond pad 78 formed according to the present invention alternate embodiment method. It is seen that a bonding wire 96, of aluminum or gold, is bonded to the top surface 98 of the metal layer 92 through solder material 94. By utilizing polysilicon gates 88 and insulating sidewalls 90, a similarly stepped surface is produced as in the preferred embodiment. The bonding stress on the top surface 98 of the metal layer 92 can therefore be more advantageously distributed during a bonding process to avoid bond pad lift-off defects.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the inventions.

The embodiment of the invention in which an exclusive property or privilege is claimed are defined as follows:

1. A chess-board patterned bond pad structure having stress buffered characteristics comprising:
   an electronic substrate,
   a multiplicity of field oxide regions formed in rows and columns embedded in a surface layer of said electronic substrate while partially protruding from a planar surface of said electronic substrate forming a first stepped surface,
   a conductive layer deposited on said electronic substrate overlying said multiplicity of field oxide regions forming a second stepped surface conforming to said first stepped surface, and
   a metal layer overlying said conductive layer conforming to a topography of said conductive layer thus forming a third stepped surface for said bond pad structure adapted for connecting to a bonding wire.

2. A chess-board patterned bond pad structure having stress-buffered characteristics according to claim 1, wherein said electronic substrate is a silicon substrate.

3. A chess-board patterned bond pad structure having stress-buffered characteristics according to claim 1, wherein said multiplicity of field oxide regions are bird's beak oxide regions grown in a top surface of a silicon wafer in both lateral and transverse directions such that a first stepped surface is produced.

4. A chess-board patterned bond pad structure having stress-buffered characteristics according to claim 1, wherein said conductive layer is formed of a non-metallic material.

5. A chess-board patterned bond pad structure having stress-buffered characteristics according to claim 1, wherein said conductive layer is a polycide layer.

6. A chess-board patterned bond pad structure having stress-buffered characteristics according to claim 1, wherein said metal layer is formed of a material selected from the group consisting of Al, AlCu and AlCuSi.

7. A chess-board patterned bond pad structure having stress-buffered characteristics according to claim 1, wherein said metal layer bonds with a bonding wire.

8. A chess-board patterned bond pad structure having stress-buffered characteristics according to claim 1 further comprising a layer of metal silicide in said polycide.

9. A chess-board patterned bond pad structure having stress-buffered characteristics according to claim 1 further comprising:
   an adhesion layer on top of said conductive layer,
   a metal pad layer formed substantially of AlSiCu on top of said adhesion layer, and
   a metal wiring layer of substantially Al on top of said metal pad layer.

10. A chess-board patterned bond pad structure having stress-buffered characteristics according to claim 1, wherein said conductive layer is formed into a multiplicity of conductive gates each situated on top of a field oxide region.

11. A chess-board patterned bond pad structure having stress-buffered characteristics according to claim 1, wherein said conductive layer is formed into a multiplicity of conductive gates each situated on top of a field oxide region, each of said conductive gates is further embedded in an oxide sidewall spacer.

12. A chess-board patterned bond pad structure having stress buffered characteristics comprising:
   a substrate,
   a multiplicity of field oxide regions formed in rows and columns embedded in a surface layer of said substrate while partially protruding from a planar surface of said substrate forming a first stepped surface,
   a multiplicity of gates each formed of a conductive material situated on each of said multiplicity of field oxide regions, and
   a metal layer overlying and conforming to a typography of said multiplicity of gates, said multiplicity of field oxide regions and said substrate forming a second stepped surface for said bond pad structure adapted for making electrical communication with a bonding wire.

13. A chess-board patterned bond pad structure having stress-buffered characteristics according to claim 12, wherein said substrate is a silicon substrate.

14. A chess-board patterned bond pad structure having a stress-buffered characteristics according to claim 12, wherein said multiplicity of field oxide regions are bird's beak oxide regions grown in a top surface of a silicon wafer in both lateral and transverse directions for forming a first stepped surface.

15. A chess-board patterned bond pad structure having a stress-buffered characteristics according to claim 12, wherein each of said multiplicity of gates is surrounded on its sides by an insulating sidewall spacer.

16. A chess-board patterned bond pad structure having a stress-buffered characteristics according to claim 12, wherein each of said multiplicity of gates is surrounded on its sides by a sidewall spacer formed of silicon oxide.

17. A chess-board patterned bond pad structure having a stress-buffered characteristics according to claim 15, wherein said insulating sidewall spacers improve bonding between said multiplicity of gates and said multiplicity of field oxide regions.

18. A chess-board patterned bond pad structure having a stress-buffered characteristics according to claim 12, wherein said multiplicity of gates are formed of a non-metallic material.

19. A chess-board patterned bond pad structure having a stress-buffered characteristics according to claim 12, wherein said metal layer is formed of a material selected from the group consisting of Al, AlCu and AlCuSi.

20. A chess-board patterned bond pad structure having a stress-buffered characteristics according to claim 12, wherein said metal layer bonds with said bonding wire.

* * * * *